US006887353B1

(12) United States Patent
Ding et al.

(10) Patent No.: US 6,887,353 B1
(45) Date of Patent: May 3, 2005

(54) TAILORED BARRIER LAYER WHICH PROVIDES IMPROVED COPPER INTERCONNECT ELECTROMIGRATION RESISTANCE

(75) Inventors: Peijun Ding, San Jose, CA (US); Tony Chiang, Mountain View, CA (US); Barry L. Chin, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 863 days.

(21) Appl. No.: 08/995,108

(22) Filed: Dec. 19, 1997

(51) Int. Cl.[7] .................. C23C 14/00; C23C 14/32; H01L 21/44
(52) U.S. Cl. .................. 204/192.15; 204/192.17; 204/192.22; 204/192.25; 438/656
(58) Field of Search .................. 204/192.15, 192.17, 204/192.22, 192.25; 438/652, 656, 660

(56) References Cited

U.S. PATENT DOCUMENTS

| | | | |
|---|---|---|---|
| 4,319,264 A | | 3/1982 | Gangulee et al. ............. 357/71 |
| 4,985,750 A | * | 1/1991 | Hoshino ...................... 257/751 |
| 5,186,718 A | | 2/1993 | Tepman et al. ............. 29/25.01 |
| 5,236,868 A | | 8/1993 | Nulman ....................... 437/190 |
| 5,240,880 A | * | 8/1993 | Hindman et al. ........... 438/656 |
| 5,281,485 A | | 1/1994 | Colgan et al. ............... 428/457 |
| 5,320,728 A | | 6/1994 | Tepman ....................... 204/192 |
| 5,391,517 A | * | 2/1995 | Gelatos et al. .............. 438/643 |
| 5,521,120 A | * | 5/1996 | Nulman et al. .............. 438/653 |
| 5,571,752 A | * | 11/1996 | Chen et al. .................. 438/642 |
| 5,676,587 A | | 10/1997 | Landers et al. ............... 451/57 |
| 5,707,498 A | * | 1/1998 | Ngan ..................... 204/192.12 |
| 5,795,796 A | * | 8/1998 | Kim ............................ 438/660 |

FOREIGN PATENT DOCUMENTS

| EP | 0 570 205 A1 | 11/1993 | ......... H01L/21/321 |
|---|---|---|---|
| EP | 0 751 566 A2 | 1/1997 | ......... H01L/23/532 |

OTHER PUBLICATIONS

Karen Holloway et al., "Tantalum as a Diffusion as a Diffusion Barrier Between Copper and Silicon: Failure Mechanism and Effect of Nitrogen Additions", J. Appl. Phys. 71 (11), Jun. 1, 1992, pp. 5433–5444.
Katsutaka Sasaki et al., "Stoichiometry of Ta–N Film and Its Application for Diffusion Barrier in the Al₃ Ta/Ta–N/Si Contact System", Japanese Journal of Applied Physics, vol. 29, No. 6, Jun. 1990, pp. 1043–1047.
E. M. Zielinski et al., "The Effects of Processing on the Microstructure of Copper Thin Films on Tantalum Barrier Layers", Mat. Res. Soc. Symp. Proc. vol. 391, (1995,) pp 303–308.
PCT International Search Report dated Mar. 25, 1999.
Gang Bai et al., "Copper Interconnection Depostion Techniques and Integration", 1996 Symposium on VLSI Technology, Digests of Technical Papers (0–7803–3342–X/96, IEEE).

S. M. Rossnagel and J. Hopwood, "Metal ion deposition from ionized magnetron sputtering discharge", *J. Vac. Sci. Technol.* B, vol. 12, No. 1, pp. 449–453 (Jan./Feb. 1994).
S. M. Rossnagel et al., "Thin, high atomic weight refractory film deposition for diffusion barrier, adhesion layer, and seed layer applications", *J. Vac. Sci. Technol.* B, vol. 14, No. 3, pp. 1819–1827 (May/Jun. 1996).
C. Steinbruchel, "Patterning of Copper for Multilevel Metallization: Reactive Ion Etching and Chemical–Mechanical Polishing", *Applied Surface Science*, 91, pp. 139–146 (1995).
U.S. Appl. No. 08/824,911, filed Mar. 27, 1997, of Ngan et al.
U.S. Appl. No. 08/863,451, filed May. 27, 1997, of Chiang et al.
U.S. Appl. No. 08/924,487, filed Aug. 23, 1997, of Ngan et al.

* cited by examiner

*Primary Examiner*—Patrick Ryan
*Assistant Examiner*—Julian Mercado
(74) *Attorney, Agent, or Firm*—Shirley L. Church

(57) ABSTRACT

Disclosed herein is a barrier layer structure useful in forming copper interconnects and electrical contacts of semiconductor devices. The barrier layer structure comprises a first layer of $TaN_x$ which is applied directly over the substrate, followed by a second layer of Ta. The $TaN_x$/Ta barrier layer structure provides both a barrier to the diffusion of a copper layer deposited thereover, and enables the formation of a copper layer having a high <111> crystallographic content so that the electromigration resistance of the copper is increased. The $TaN_x$ layer, where x ranges from about 0.1 to about 1.5, is sufficiently amorphous to prevent the diffusion of copper into the underlying substrate, which is typically silicon or a dielectric such as silicon dioxide. The thickness of the $TaN_x$ and Ta layers used for an interconnect depend on the feature size and aspect ratio; typically, the $TaN_x$ layer thickness ranges from about 50 Å to about 1,000 Å, while the Ta layer thickness ranges from about 20 Å to about 500 Å. For a contact via, the permissible layer thickness on the via walls must be even more carefully controlled based on feature size and aspect ratio; typically, the $TaN_x$ layer thickness ranges from about 10 Å to about 300 Å, while the Ta layer thickness ranges from about 5 Å to about 300 Å. The copper layer is deposited at the thickness desired to suit the needs of the device. The copper layer may be deposited using any of the preferred techniques known in the art. Preferably, the entire copper layer, or at least a "seed" layer of copper, is deposited using physical vapor deposition techniques such as sputtering or evaporation, as opposed to CVD or electroplating. Since the crystal orientation of the copper is sensitive to deposition temperature, and since the copper may tend to dewet/delaminate from the barrier layer if the temperature is too high, it is important that the copper be deposited and/or annealed at a temperature of less than about 500° C., and preferably at a temperature of less than about 300° C.

7 Claims, 2 Drawing Sheets

US 6,887,353 B1

TAILORED BARRIER LAYER WHICH PROVIDES IMPROVED COPPER INTERCONNECT ELECTROMIGRATION RESISTANCE

BACKGROUND OF THE INVENTION

1. Field of the Invention

The present invention pertains to a particular $TaN_x/Ta$ barrier/wetting layer structure which increases the degree of {111} crystal orientation in an overlying copper layer, thereby providing improved electromigration resistance of the copper.

2. Brief Description of the Background Art

As microelectronics continue to miniaturize, interconnection performance, reliability, and power consumption has become increasingly important, and interest has grown in replacing aluminum alloys with lower-resistivity and higher-reliability metals. Copper offers a significant improvement over aluminum as a contact and interconnect material. For example, the resistivity of copper is about 1.67 $\mu\Omega$cm, which is only about half of the resistivity of aluminum.

There are two principal competing technologies under evaluation by material and process developers working to enable the use of copper. The first technology is known as damascene technology. In this technology, a typical process for producing a multilevel structure having feature sizes (i.e., width of the aperture) in the range of 0.5 micron ($\mu$m) or less would include: blanket deposition of a dielectric material; patterning of the dielectric material to form openings; deposition of a diffusion barrier layer and, optionally, a wetting layer to line the openings; deposition of a copper layer onto the substrate in sufficient thickness to fill the openings; and removal of excessive conductive material from the substrate surface using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995)139–146.

The competing technology is one which involves the patterned etch of a copper layer. In this technology, a typical process would include deposition of a copper layer on a desired substrate (typically a dielectric material having a barrier layer on its surface); application of a patterned hard mask or photoresist over the copper layer; pattern etching of the copper layer using wet or dry etch techniques; and deposition of a dielectric material over the surface of the patterned copper layer, to provide isolation of conductive lines and contacts which comprise various integrated circuits.

Typically, the copper layer can be applied using sputtering techniques well known in the art. The sputtering of copper provides a much higher deposition rate than evaporation or CVD (chemical vapor deposition) and provides a purer copper film than CVD.

In integrated circuit interconnect structures where copper is the material used to form conductive lines and contacts, it is recognized that copper diffuses rapidly into adjacent layers of $SiO_2$ and silicon and needs to be encapsulated. Gang Bai et al. in "Copper Interconnection Deposition Techniques and Integration", 1996 Symposium on VLSI Technology, Digests of Technical Papers (0-7803-3342-X/96, IEEE), describe the effectiveness of Ta, TiN, W and Mo as barrier layers for use with copper. They concluded that Ta annealed in UHV (ultra high vacuum) after copper deposition provided the best barrier layer. Sputtered copper appeared to be preferable over CVD copper and over electroplated copper, although all the data for electroplated copper was not available at the time of presentation of the paper.

U.S. Pat. No. 4,319,264 of Gangulee et al., issued Mar. 9, 1982 and titled "Nickel-gold-nickel Conductors For Solid State Devices" discusses the problem of electromigration in solid state devices. In particular, the patent discusses the application of direct current over particular current density ranges which induces motion of the atoms comprising the thin film conductor, the effect known as electromigration. Electromigration is said to induce crack or void formation in the conductor which, over a period of time, can result in conductor failure. The rate of electromigration is said to be dependent on the current density imposed on the conductor, the conductor temperature, and the properties of the conductor material. In high current density applications, potential conductor failure due to electromigration is said to severely limit the reliability of the circuit. In discussing the various factors affecting performance of the conductive materials, grain structure is mentioned as being important. (In order to obtain adequate lithographic line width resolution, it is recommended that the film be small grained, with a grain size not exceeding about one-third of the required line width.) Uniformity of grain size and preferred crystallographic orientation of the grains are also said to be factors which promote longer (electromigration limited) conductor lifetimes. Fine grained films are also described as being smoother, which is a desirable quality in semiconductor applications, to lessen difficulties associated with covering the conductor with an overlayer.

U.S. Pat. No. 5,571,752 to Chen et al., issued Nov. 5, 1996, discloses a method for patterning a submicron semiconductor layer of an integrated circuit. In one embodiment describing an aluminum contact, titanium or titanium nitride having a thickness of between approximately 300 and 2,000 Å is formed by sputter deposition to reach the bottom of a contact opening. Finally, a second conductive layer, typically aluminum, is applied over the surface of the conformal conductive layer. The aluminum is sputtered on, preferably at a temperature ranging between approximately 100° C. and 400° C. This method is said to make possible the filling of contact openings having smaller device geometry design requirements by avoiding the formation of fairly large grain sizes in the aluminum film.

As described in U.S. patent application Ser. No. 08/824,911, of Ngan et al., filed Mar. 27, 1997 and commonly assigned with the present invention, efforts have been made to increase the <111> crystallographic content of aluminum as a means of improving electromigration of aluminum. In particular, the <111> content of an aluminum layer was controlled by controlling the thickness of various barrier layers underlying the aluminum layer. The underlying barrier layer structure was $Ti/TiN/TiN_x$, which enabled aluminum filling of high aspect vias while providing an aluminum fill exhibiting the high degree of aluminum <111> crystal orientation. The $Ti/TiN/TiN_x$ barrier layer was deposited using IMP (ion metal plasma) techniques, and the barrier layer thicknesses were as follows. The thickness of the first layer of Ti ranges from greater than about 100 Å to about 500 Å (the feature geometry controls the upper thickness limit). The thickness of the TiN second layer ranges from greater than about 100 Å to less than about 800 Å (preferably, less than about 600 Å). And, the $TiN_x$ third layer (having a Ti content ranging from about 50 atomic percent titanium to about 100 atomic percent titanium) ranges from about 15 Å to about 500 Å. A Ti/TiN/TiN$_x$ barrier layer having this structure, used to line a contact via, is described as enabling complete filling of via with sputtered warm aluminum, where the feature size of the via or aperture is about 0.25 micron or less and the aspect ratio ranges from about 5:1 to as high as about 6:1.

Subsequently, in U.S. Pat. No. 5,882,399, of Ngan et al., issued Mar. 16, 1999, the inventors disclose that to maintain a consistently high aluminum <111> crystal orientation content of an interconnect during the processing of a series of semiconductor substrates in a given process chamber, it is necessary to form the first deposited layer of the barrier layer to a minimal thickness of at least about 150 Å, to compensate for irregularities in the crystal orientation which may be present during the initial deposition of this layer when the process chamber is initially started up (and continuing for the first 7–8 wafers processed). Ngan et al. teach that in the case of a copper conductive layer, it may also be necessary that the first layer of a barrier layer structure underlying the copper layer have a minimal thickness of at least about 150 Å, to enable a consistent crystal orientation within the copper layer during the processing of a series of wafers in a semiconductor chamber.

SUMMARY OF THE INVENTION

We have discovered that tantalum nitride (TaN$_x$) is a better barrier layer for copper than tantalum (Ta). However, copper deposited directly over TaN$_x$ does not exhibit a sufficiently high degree of <111> crystal orientation to provide the desired copper electromigration characteristics. We have developed a barrier layer structure comprising a layer of Ta overlying a layer of TaN$_x$ which provides both a barrier to the diffusion of a copper layer deposited thereover, and enables the formation of a copper layer having a high <111> crystallographic content, so that copper electromigration resistance is increased.

The TaN$_x$ layer, where x ranges from about 0.1 to about 1.5, is sufficiently amorphous to prevent the diffusion of copper into underlying silicon or silicon oxide surfaces. The desired thickness for the TaN$_x$ layer is dependent on the device structure. For a typical interconnect, the TaN$_x$ layer thickness ranges from about 50 Å to about 1,000 Å. For a contact, the TaN$_x$ layer, the thickness on the wall of a contact via ranges from about 10 Å to about 300 Å, depending on the feature size. The TaN$_x$ layer is preferably deposited using standard reactive ion sputtering techniques at a substrate temperature ranging from about 20° C. to about 500° C. However, ion deposition sputtering techniques may be used to deposit this layer.

The Ta layer deposited over the TaN$_x$ layer has a desired thickness ranging from about 5 Å to about 500 Å, wherein the thickness is preferably greater than about 20 Å, depending on the feature size. The Ta layer is preferably deposited using standard ion sputtering techniques at a substrate temperature ranging from about 20° C. to about 500° C. However, ion deposition sputtering techniques may be used to deposit this layer.

The copper layer is deposited at the thickness desired to suit the needs of the device. The copper layer may be deposited using any of the preferred techniques known in the art. Preferably, the entire copper layer or at least a "seed" layer of copper is deposited using physical vapor deposition techniques such as sputtering or evaporation, as opposed to CVD. Since the crystal orientation of the copper is sensitive to deposition temperature, it is important that the maximum temperature of the copper either during deposition or during subsequent annealing processes not be higher than about 500° C. Preferably, the maximum temperature is about 300° C.

We have also developed a method of producing a copper interconnect structure comprising a copper layer deposited over a barrier layer structure of the kind described above, comprising a Ta layer overlying a TaN$_x$ layer, where the Cu <111> crystallographic content is at least 70% of the Cu <111> crystallographic content which can be obtained by depositing the copper layer over a pure Ta barrier layer which is about 500 Å thick. The method comprises the steps of:

a) depositing a first layer of TaN$_x$ having a thickness ranging from greater than about 50 Å to about 1,000 Å;

b) depositing a second layer of Ta having a thickness ranging from about 5 Å to about 500 Å over the surface of the first layer of TaN$_x$; and c) depositing a third layer of copper over the surface of the second layer of Ta, wherein at least a portion of the third layer of copper is deposited using a physical vapor deposition technique, and wherein the substrate temperature at which the third layer of copper is deposited is less than about 500° C.

Further, we have developed a method of producing a copper-comprising contact via structure comprising a copper layer deposited over a barrier layer structure of the kind described above, comprising a Ta layer overlying a TaN$_x$ layer; wherein the Cu <111> crystallographic content is at least 70% of the Cu <111> crystallographic content which can be obtained by depositing said copper layer over a pure Ta barrier layer which is about 300 Å thick. The method comprises the steps of:

a) depositing a first layer of TaN$_x$ having a thickness ranging from greater than about 10 Å to about 300 Å;

b) depositing a second layer of Ta having a thickness ranging from about 5 Å to about 300 Å over the surface of said first layer of TaN$_x$; and c) depositing a third layer of copper over the surface of the second layer of Ta, wherein at least a portion of the third layer of copper is deposited using a physical vapor deposition technique, and wherein the substrate temperature at which the third layer of copper is deposited is less than about 500° C.

In the method of producing a copper-comprising contact structure described above, a least a portion of the first layer of TaN$_x$, or the second layer of Ta, or the third layer of Cu, or at least a portion of more than one of these three layers may be deposited using ion-deposition sputtering, where at least a portion of the sputtered emission is in the form of ions at the time the emission reaches the substrate surface, and where, typically 10% or more of the sputtered emission is in the form of ions at the time the emission reaches the substrate surface.

DETAILED DESCRIPTION OF THE PREFERRED EMBODIMENTS

Figure 1:
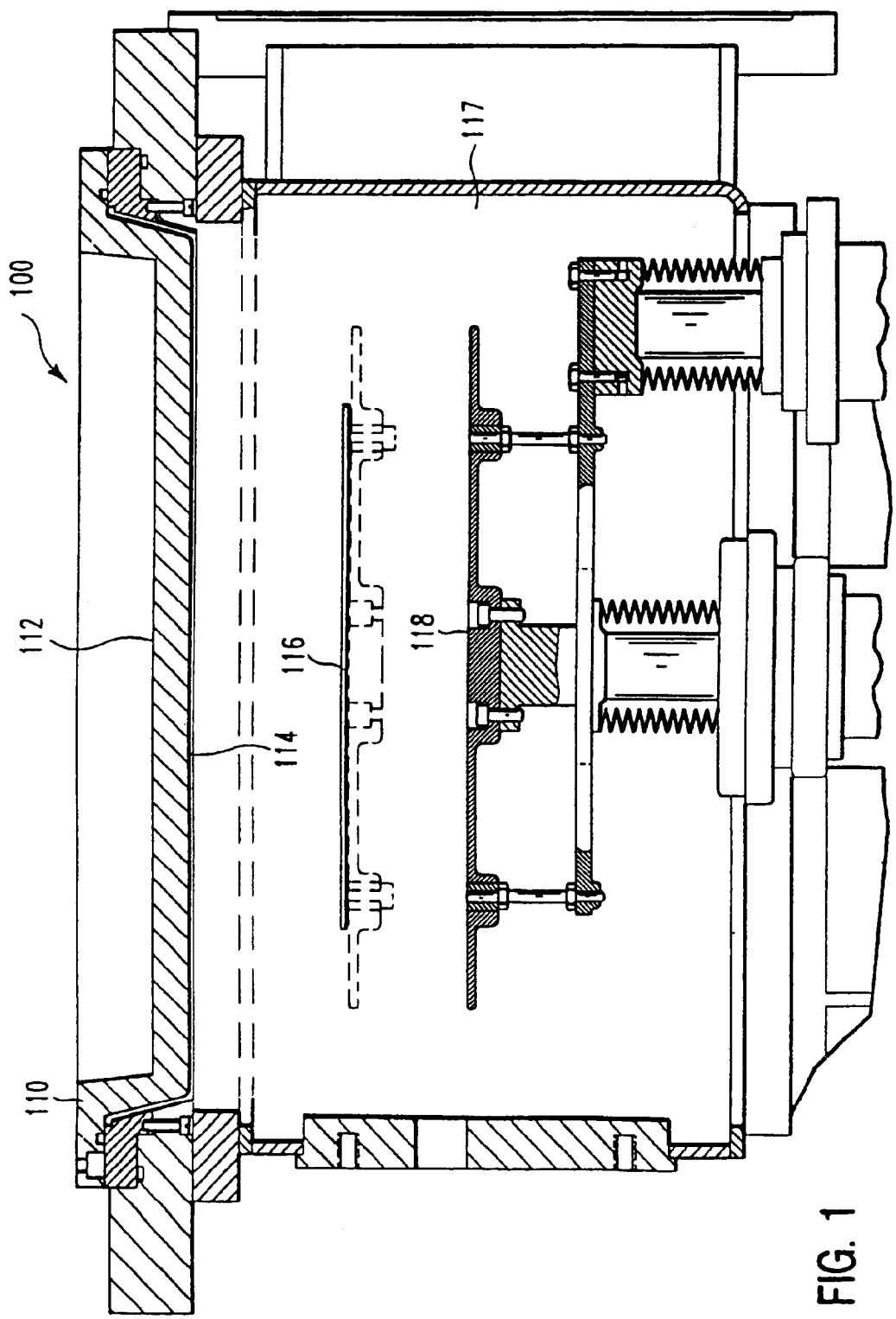
FIG. 1 shows a schematic of a cross sectional view of a sputtering chamber of the kind which can be used to deposit the barrier layer of the present invention.

The present disclosure pertains to a TaN$_x$/Ta/Cu structure and a method of creating that structure. The TaN$_x$/Ta barrier layer structure enables the deposition of an overlying copper layer having a high <111> crystallographic content, so that electromigration resistance of the copper is increased.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" or "interconnect material" includes copper and copper alloys, and other conductive materials which have a melting point enabling them to be sputtered over the temperature range described herein.

Specific terminology of particular importance to the description of the present invention is defined below.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "contact via" or "via" refers to an electrical contact having an aspect ratio which is typically greater than 1:1. A contact via most frequently extends through multiple layers of material to connect one electrically conductive element with another.

The term "copper" includes alloys of copper of the kind typically used in the semiconductor industry. The preferred embodiments described herein were for a copper alloy comprising about 98% by weight copper.

The term "feature" refers to contacts, vias, trenches, and other structures which make up the topography of the substrate surface.

The term "interconnect" generally refers to conductive structures within a semiconductive device. For purposes of this patent application, electrical contacts in the form of a "contact via" or "via" (which has a higher aspect ratio than conductive lines in trenches, for example) is distinguished from other conductive structures which form interconnects.

The term "ion-deposition sputtered" and the term "reactive ion metal plasma (IMP)" refer to sputter deposition using a particular technique, wherein a high density, inductively coupled RF plasma is positioned between the sputtering cathode and the substrate support electrode, whereby at least a portion of the sputtered emission is in the form of ions at the time it reaches the substrate surface. Typically, 10% or more of the sputtered emission is in the form of ions at the time it reaches the substrate surface.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

The term "XRD" (X-ray Diffraction) refers to a technique commonly used to measure crystalline orientation, wherein radiation over particular wavelengths is passed through the material to be characterized, and the diffraction of the radiation, caused by the material through which it passes, is measured. A map is created which shows the diffraction pattern, and the crystal orientation is calculated based on this map.

A "traditionally sputtered" tantalum nitride-comprising film or layer is deposited on a substrate by contacting a tantalum target with a plasma created from an inert gas such as argon in combination with nitrogen gas. A portion of the tantalum sputtered from the target reacts with nitrogen gas which has been activated by the plasma to produce tantalum nitride, and the gas phase mixture contacts the substrate to form a layer on the substrate.

II. An Apparatus for Practicing the Invention

A process system in which the method of the present invention may be carried out is the Applied Materials, Inc. (Santa Clara, Calif.) Endura® Integrated Processing System. This process system is not specifically shown in the Figures. However, the system is generally known in the semiconductor processing industry and is shown and described in U.S. Pat. Nos. 5,186,718 and 5,236,868, the disclosures of which are incorporated by reference. A schematic of a typical sputtering apparatus useful in forming the smooth-surfaced $TaN_x$/Ta barrier layer of the present invention is shown in FIG. 1. Sputtering apparatus 100 includes a sputtering target 110 which has two major surfaces, a back surface 112 from which heat is removed, and a front surface 114 which is the sputtering surface. The sputtered material is deposited on the surface of semiconductor workpiece 116 which is supported on platen 118. The spacing between the workpiece 116 and the target 110 may be adjusted by moving the platen 118. The sputtering target (cathode) 110 operates at power levels up to about 24 kW. An ionized gas, typically generated from an inert gas such as argon is used to impact sputtering target 110, to produce sputtered metal atoms which are deposited on workpiece 116. The inert gas enters vacuum chamber 117 in the vicinity to target 112 through openings which are not shown on FIG. 1. Additional gas may enter vacuum chamber 117 from the surface of workpiece support platen 118, which includes openings (not shown) in its surface to permit the flow of heat transfer gas between workpiece 116 and support platen 118. Such gases are evacuated through an opening (not shown) in vacuum chamber 117, which opening is connected to a conduit (not shown) leading to a vacuum pump (not shown). Vacuum chamber 117 can be operated at pressures ranging from about 0.1 mT to about 60 mT, depending on the particular process involved.

III. A Method for Practicing the Invention

EXAMPLE ONE

Formation of a $TaN_x$/Ta Barrier Layer

To form the $TaN_x$/Ta barrier layer structure, a tantalum target cathode 110 was used, and a DC power was applied to this cathode over a range from about 0.5 kW to about 8 kW. The spacing between target cathode 110 and workpiece 116 was approximately 200–300 mm. During the formation of the TaN$_x$ first layer, argon gas feed to vacuum chamber 117 was about 15 scam to the substrate support platen 118 and about 7 sccm to the openings in the vicinity of target cathode 110. Nitrogen gas was also fed into vacuum chamber 117 in the vicinity of target cathode 110. The nitrogen gas feed rate ranged from about 2 to about 20 sccm, depending on the DC power applied, with the nitrogen feed rate being increased as the DC power was increased. With the DC power set at 4 kW and a nitrogen feed rate of about 14 sccm, the TaN$_x$ layer produced was TaN$_{0.7}$, containing about 40 atomic percent nitrogen.

The substrate 116 was a 200 mm diameter silicon wafer having a silicon dioxide dielectric layer on its surface. The substrate was placed a distance of about 10 inches (25 cm) from target cathode 110. The operational pressure in vacuum chamber 117 was about 1.7 mT, and the substrate temperature of the silicon wafer was about 25° C. Under these conditions, a 500 Å thick layer of TaN was applied in approximately one minute.

Subsequent to application of the TaN layer, the nitrogen gas was shut off, the power to tantalum target cathode 110 was reduced from about 4 kW to about 1 kW, and the argon gas feed was maintained. The pressure in the vacuum chamber remained at about 1.7 mT, and the substrate temperature remained at about 25° C. Under these conditions, a 60 Å thick layer of tantalum was formed over the TaN layer in about 10 seconds.

Figure 2:
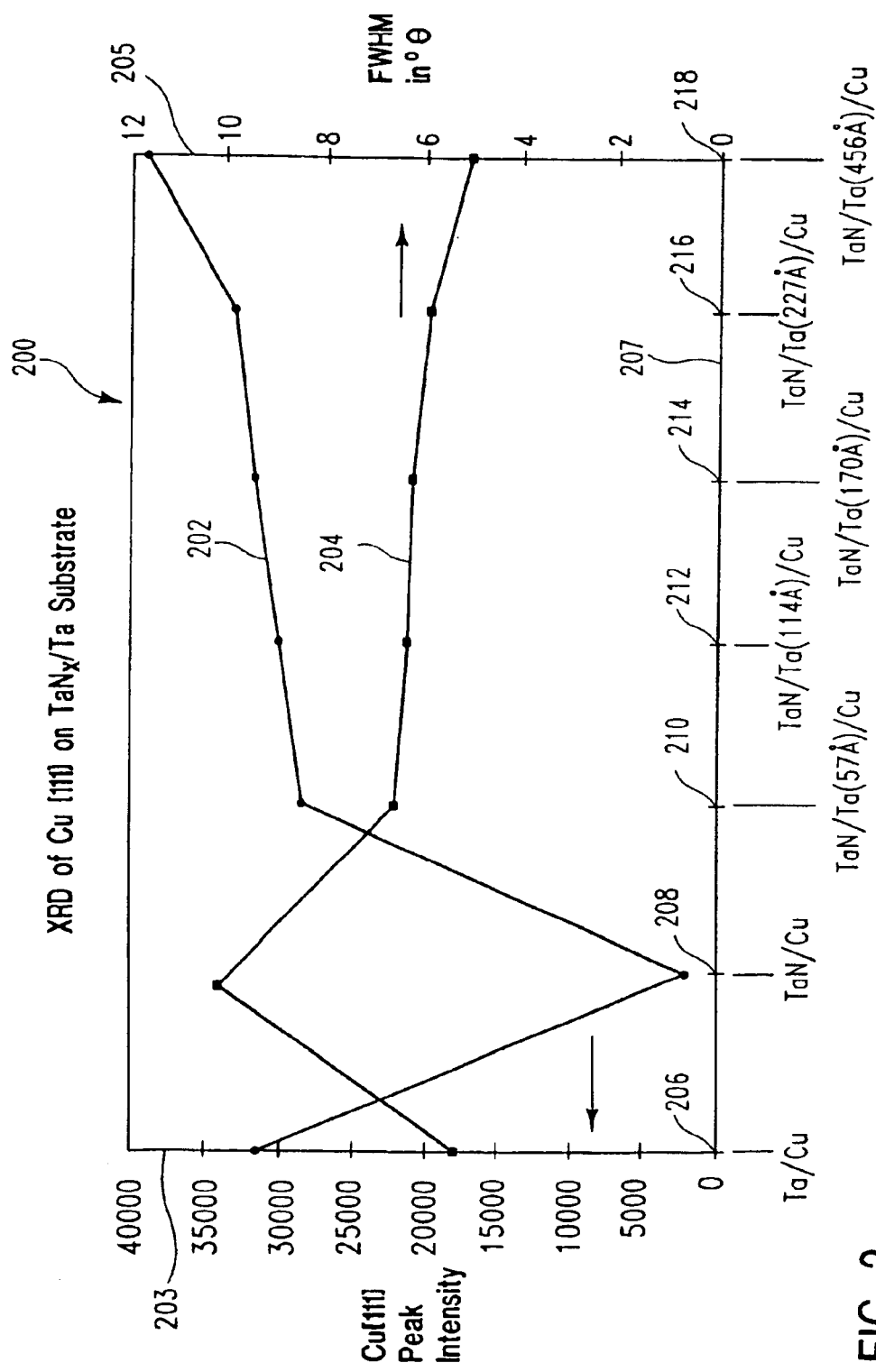
FIG. 2 shows a graph representative of the copper <111> crystal orientation on a TaN$_x$/Ta barrier layer as a function of the thickness of the Ta layer, with the TaN$_x$ layer held constant at about 500 Å.

The data generated in FIG. 2 was for TaN/Ta barrier layers produced in the manner described above, where the length of time for tantalum deposition was increased to produce a thicker tantalum layer, as appropriate.

EXAMPLE TWO

Formation of the Copper Conductive Layer

The copper layer overlying the TaN barrier layer was applied using the same apparatus described with regard to application of the TaN barrier layer. The target cathode 110 was copper. During the formation of the overlying Cu layer, argon gas feed to vacuum chamber 117 was about 15 sccm to the substrate support platen 118 and about 90 sccm to the openings in the vicinity of target cathode 110. The substrate, having a tantalum layer as its upper surface, was placed a distance of about 10 inches (25 cm) from target cathode 110. The operational pressure in vacuum chamber 117 was about 1.0 mT, and the substrate temperature was about 150° C. Under these-conditions, a 1,000 Å thick layer of copper was applied in about one minute.

With reference to the formation of the TaN$_x$/Ta/Cu structure in general, it is advisable to use the minimal thickness possible for the tantalum layer, as a flatter structure is preferred for planarization and imaging purposes, and it is difficult to remove excess tantalum from the surface of the workpiece. When chemical mechanical polishing is used to remove material on the surface of the workpiece between features (known as the "field"), the removal rate for tantalum is much slower than the copper removal rate. As a result, in order to ensure complete removal of copper and Ta/TaN$_x$ from the field, the copper may be over polished, creating a "dishing effect" in the area of a contact, where the copper is removed from the contact to a level below the surface of the substrate/workpiece. In addition, there is a cost in substrate processing time.

The minimal thickness for the tantalum layer is determined by the desired performance features for the layer. The layer must be sufficiently thick to provide a tantalum <002> crystalline orientation which enables easy wetting of the tantalum surface by the copper and depositing of a copper layer having a high <111> crystal orientation. Although a higher temperature is required to dewet/delaminate a depositing copper layer from a Ta surface than from a TaN$_x$ surface, copper delamination is a problem in some instances. Typically, the copper layer is deposited at temperatures in the range of about 300° C. to about 500° C. (or a copper seed layer is deposited at lower temperatures, but additional copper is deposited and the combination is annealed at temperatures in this range), where delamination of the copper layer is a real possibility. When the copper is deposited for flat interconnect lines, the wetting criteria is not as important as it is when the copper is deposited to fill a contact via having a high aspect ratio (i.e., depth greater than width).

As the thickness of the tantalum layer increases, the wetting of the tantalum by a layer of copper applied thereover generally improves. As the thickness of the tantalum layer increases, the copper <111> crystallographic content generally increases as well. The limitation on tantalum layer thickness is defined by the device feature size, in particular. If the TaN$_x$ or the Ta layer is too thick, the overall resistance of the conductive feature increases. If these layers are too thin, the barrier may not be adequate to prevent diffusion; further, if the Ta layer is too thin, the copper <111> crystallographic content may be inadequate to provide the desired electromigration resistance.

In general, the copper <111> crystallographic content is poorer when copper is applied directly over a TaN$_x$ layer due to the amorphous structural content of the TaN$_x$ layer. Further, copper applied by means other than sputtering, where the copper layer itself has a higher impurity level (such as copper applied by CVD), may result in an unacceptably low copper <111> crystallographic content. The use of a Ta layer over the TaN$_x$ layer can produce an acceptable surface for growth of a high copper <111> crystallographic content. Deposition of a seed layer of copper over the Ta surface prior to application of the entire copper contact by other means, such as CVD, provides a starting matrix for copper growth, since some CVD precursors and electroplating require a conductive substrate for the copper deposition process to take place. Further, the copper seed layer promotes an increase in the copper <111> crystallographic content.

IV. The Structure of the TaN$_x$)/Ta Barrier Layer and its Effect on the Copper {111} Crystallographic Content FIG. 2 shows a graph 200 of the <111> crystallographic content (measured by XRD) of a copper layer as a function of the thickness of the Ta layer of a TaN$_x$/Ta barrier layer.

In particular, the various specimens examined (prepared using the method described above) are represented on the scale labeled 207. The layers of material were deposited using standard, traditional sputtering techniques. In all instances, the copper layer was 1,000 Å thick. In all instances, except the data point labeled 206, the underlying layer of TaN$_x$ was 500 Å thick. The data point labeled 206 represents a 500 Å thick Ta (only) barrier layer. The data point labeled 208 represents a 500 Å thick TaN$_x$ (only) barrier layer. The data point labeled 210 represents the TaN$_x$/TaN structure where the overlying Ta layer was 57 Å thick. The data point labeled 212 represents the TaN$_x$/Ta structure where the overlying Ta layer was 114 Å thick. The data point labeled 214 represents the TaN$_x$/Ta structure where the overlying Ta layer was 170 Å thick. The data point labeled 216 represents the TaN$_x$/Ta structure where the overlying Ta layer was 227 Å thick. And, the data point labeled 218 represents the TaN$_x$/Ta structure where the overlying Ta layer was 456 Å thick.

The XRD scanning of these specimens was done using the standard θ-2θ technique, with the relative normalized area under the Cu <111> intensity peak shown on the scale labeled 203. Curve 202 illustrates the normalized area under the Cu <111> CPS (counts per second) intensity peak for the specimens previously described, with the Ta layer thickness increasing from left to right on the curve beginning with data point 210. A second measurement indicating the amount of the Cu <111> orientation present is provided in the rocking curve data shown on the scale labeled 205. The data represents the Cu <111> FWHM measured in degrees θ.

In the rocking curve measurement technique, the sample is rotating and the detector is rotating. The CPS measurement is made at a set angle and then the detector is slightly rotated and a new CPS is measured. A plot of the CPS at increasing angle of measurement is made, generating a distribution curve of the quantity of the specific crystal orientation measured at increasing angles.

FWHM=full width half max. FWHM is calculated by measuring the width of the curve at a position on the curve which represents one half of the maximum height of the curve. The FWHM is expressed in degrees and represents the number of degrees spanned by the width of the curve at half of its maximum height. A wider curve (a higher number on the scale), spanning a larger number of degrees, indicates that the signal for the crystallographic orientation of interest is not a strong signal and less copper <111> crystallographic orientation is present. A narrow curve (a lower number on the scale), spanning a limited number of degrees, is a strong signal, indicating a larger quantity of the crystallographic orientation is present. Curve 204 illustrates the FWHM. for the specimens previously described, with the Ta layer thickness increasing from left to right on the curve beginning with data point 210.

Data point 206 on curve 202 shows the normalized area under the Cu <111> intensity peak for the specimen having a 500 Å thick Ta layer underlying the 1,000 Å thick sputtered copper layer. As is evident from the curve 202, the quantity of Cu <111> crystal orientation is relatively high. However, as previously mentioned, a layer of pure Ta does not provide a diffusion barrier which performs as well as the TaN$_x$/Ta barrier layer structure in preventing copper diffusion into the underlying silicon dioxide dielectric layer.

Data point 208 on curve 202 shows the normalized area under the Cu <111> intensity peak for the specimen having a 500 Å thick TaN layer underlying the 1,000 Å thick sputtered copper layer. Although the TaN layer provides a good diffusion barrier, the quantity of Cu <111> is minimal. Data points 210 through 216 on curve 202 show the normalized area under the Cu <111> intensity peak for specimens having a 500 Å thick TaN layer, with increasing thicknesses of an overlying Ta layer (as the data point number increases), all with a 1,000 Å layer of copper applied over the TaN/Ta barrier layer. The 500 Å TaN/57 Å Ta barrier layer of data point 210 provides about 10% less area under the Cu <111> peak than the 500 Å layer of Ta provided. The exact significance of this decrease in electromigration performance has not yet been determined; however, the difference is not expected to have a significant influence on device performance.

At data point 214 on curve 202, which represents the 500 Å TaN/170 Å Ta barrier layer, the area under the Cu <111> speak is equivalent to the pure layer of Ta. Surprisingly, at some point between the 500 Å TaN/227 Å Ta barrier layer represented by data point 216 and the 500 Å TaN/456 Å Ta barrier layer represented by data point 218, the Cu <111> crystal content increases drastically, rising to a value about 20% greater than that for the pure layer of Ta. The FWHM data shown on curve 204 for the same specimens described above confirms the same trends illustrated by the normalized area under the Cu <111> intensity peak. See, for example, a lower FWHM after data point 216 on curve 204, indicating an increased amount of the copper <111> crystallographic orientation.

Based on this disclosure, one skilled in the art can provide a barrier layer which prevents the diffusion of a copper layer deposited thereover, and enable the formation of a copper layer having a high <111> crystallographic content.

The above described preferred embodiments are not intended to limit the scope of the present invention, as one skilled in the art can, in view of the present disclosure expand such embodiments to correspond with the subject matter of the invention claimed below.

We claim:

1. A method of producing a copper interconnect structure comprising a combined TaN$_x$/Ta barrier layer and wetting layer, and an overlying copper layer, wherein the Cu <111> crystallographic content of said overlying copper layer is at least 70% of the Cu <111> crystallographic content which can be obtained by depositing said copper layer over a pure Ta barrier layer which is about 500 Å thick, said method comprising the steps of:
    a) depositing a first layer of TaN$_x$ having a thickness ranging from greater than about 50 Å to about 1,000 Å;
    b) depositing a second layer of Ta having a thickness ranging from about 5 Å to about 500 Å over the surface of said first layer of TaN$_x$; and
    c) depositing a third layer of copper over the surface of said second layer of Ta, wherein at least a portion of said third layer of copper is deposited using a physical vapor deposition technique, and wherein the substrate temperature at which said third layer of copper is deposited is less than about 500° C.

2. The method of claim 1, wherein said copper interconnect structure is annealed at a temperature of less than about 500° C.

3. A method of producing a copper-comprising contact via structure comprising a combined TaN$_x$/Ta barrier layer and wetting layer, and an overlying copper layer, wherein the Cu <111> crystallographic content of said overlying copper layer is at least 70% of the Cu {111} crystallographic content which can be obtained by depositing said copper layer over a pure Ta barrier layer which is about 300 Å thick, said method comprising the steps of:
    a) depositing a first layer of TaN$_x$ having a thickness ranging from greater than about 10 Å to about 300 Å;
    b) depositing a second layer of Ta having a thickness ranging from about 5 Å to about 300 Å over the surface of said first layer of TaN$_x$; and
    c) depositing a third layer of copper over the surface of said second layer of Ta, wherein at least a portion of said third layer of copper is deposited using a physical vapor deposition technique, and wherein the substrate temperature at which said third layer of copper is deposited is less than about 500° C.

4. The method of claim 3, wherein said contact-comprising structure is annealed at a temperature of less than about 500° C.

5. The method of claim 3, wherein said copper layer is deposited at a temperature of less than about 300° C.

6. The method of claim 5, wherein said structure is annealed at a temperature of less than about 500° C.

7. A method of producing a copper-comprising contact structure comprising a combined $TaN_x$/Ta barrier layer and wetting layer, and an overlying copper layer, wherein the Cu <111> crystallographic content of said overlying copper layer is at least 70% of the Cu <111> crystallographic content which can be obtained by depositing said copper layer over a pure Ta barrier layer which is about 300 Å thick, said method comprising the steps of:

a) depositing a first layer of $TaN_x$ having a thickness ranging from greater than about 10 Å to about 300 Å;

b) depositing a second layer of Ta having a thickness ranging from about 5 Å to about 300 Å over the surface of said first layer of $TaN_x$; and c) depositing a third layer of copper over the surface of said second layer of Ta, wherein at least a portion of said third layer of copper is deposited using a physical vapor deposition technique, and wherein the substrate temperature at which said third layer of copper is deposited is less than about 500° C., wherein at least a portion of said first layer, or said second layer, or said third layer, or a portion of a combination of said layers, is deposited using ion-deposition sputtering.

* * * * *